US012716921B2

(12) United States Patent
Mori

(10) Patent No.: US 12,716,921 B2
(45) Date of Patent: Aug. 25, 2026

(54) VOLTAGE DETECTING CIRCUIT AND INFORMATION PROCESSING APPARATUS

(71) Applicant: Fujitsu Limited, Kawasaki (JP)

(72) Inventor: Atsushi Mori, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 154 days.

(21) Appl. No.: 18/666,879

(22) Filed: May 17, 2024

(65) Prior Publication Data

US 2025/0004019 A1 Jan. 2, 2025

(30) Foreign Application Priority Data

Jun. 29, 2023 (JP) ................................ 2023-107502

(51) Int. Cl.
*G01R 19/00* (2006.01)
*H03K 3/03* (2006.01)

(52) U.S. Cl.
CPC ....... *G01R 19/0038* (2013.01); *H03K 3/0315* (2013.01)

(58) Field of Classification Search
CPC . G01R 19/0084; G01R 19/0038; G01R 21/06
See application file for complete search history.

(56) References Cited

U.S. PATENT DOCUMENTS

| | | | | |
|---|---|---|---|---|
| 6,549,081 B1 * | 4/2003 | Le | H03K 3/0315 327/131 |
| 2004/0095116 A1 * | 5/2004 | Kernahan | G06F 1/24 713/300 |
| 2007/0001771 A1 * | 1/2007 | Hori | H03K 5/133 331/57 |
| 2007/0273450 A1 * | 11/2007 | Burton | H03K 5/19 331/57 |
| 2009/0251103 A1 | 10/2009 | Yamamoto et al. | |
| 2012/0242314 A1 * | 9/2012 | Namekawa | H03K 7/08 323/283 |
| 2012/0307867 A1 * | 12/2012 | Chung | G01R 19/0084 374/170 |

FOREIGN PATENT DOCUMENTS

JP 2009-268068 A 11/2009

* cited by examiner

*Primary Examiner* — Huy Q Phan
*Assistant Examiner* — Temilade S Rhodes-Vivour
(74) *Attorney, Agent, or Firm* — Fujitsu Intellectual Property Center

(57) ABSTRACT

A ring oscillator included in a reference-frequency generating circuit and a comparative-frequency generating circuit has multiple inverters that are arranged in series in a ring shape. A sampling unit acquires an output signal from the respective inverters in each sampling cycle. A transition-stage calculating unit calculates the number of transition stages that is the number of inverters in which a value of an output signal has changed during the sampling cycle of each ring oscillator based on the output signal of each sampling cycle acquired by the sampling unit. A voltage detecting unit performs voltage detection based on the number of transition stages acquired by the transition-stage calculating unit.

5 Claims, 11 Drawing Sheets

EXTERNAL POWER SOURCE
2
1
REGULATOR
20
TARGET-VOLTAGE OUTPUT CIRCUIT
10
VOLTAGE DETECTION CIRCUIT
+
-
30
LDO-CONTROL LOGIC CIRCUIT
40
PMOS HEADER
CONTROL TARGET CIRCUIT
3

FIG.2

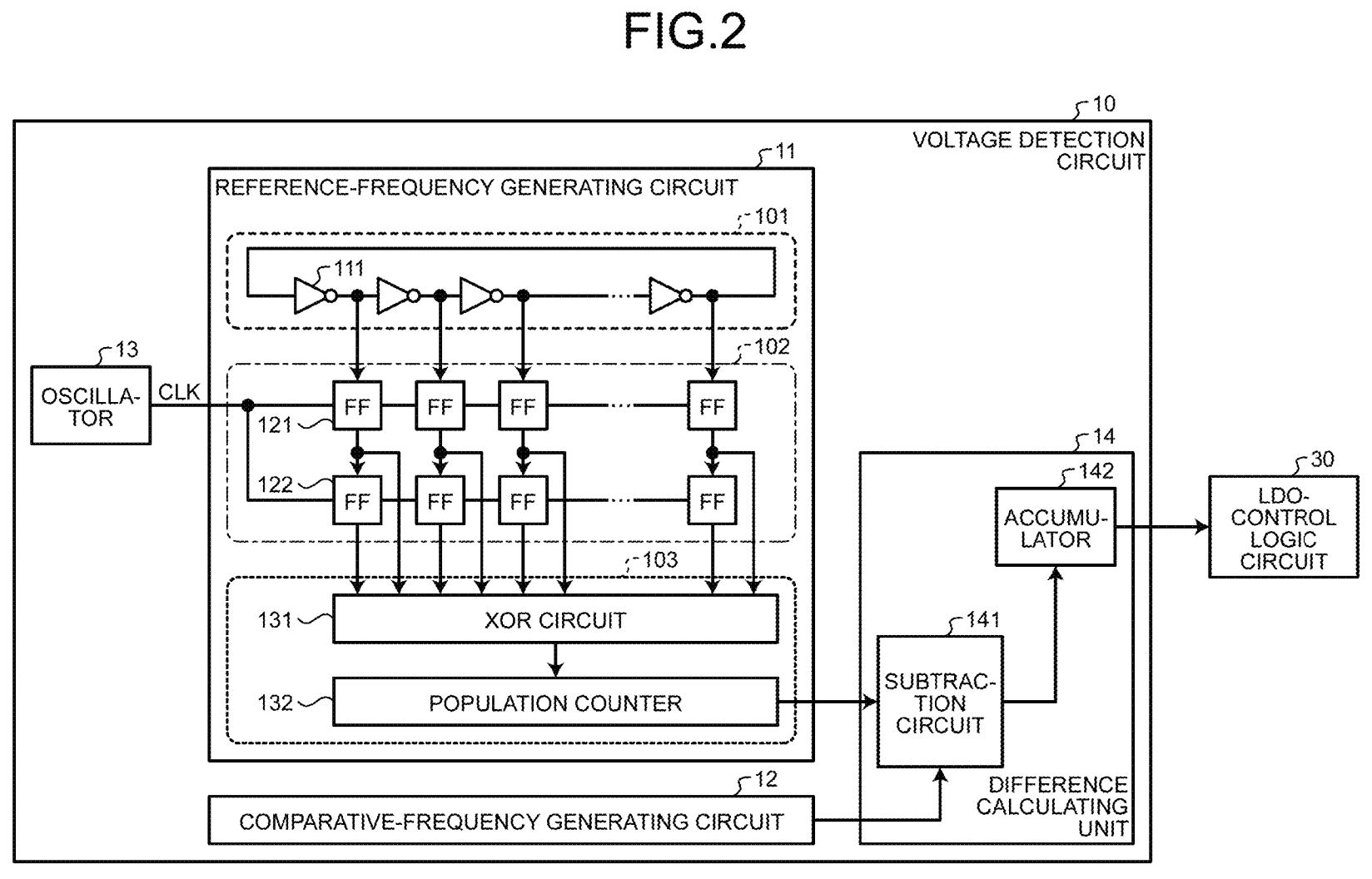

VOLTAGE DETECTION CIRCUIT
10
REFERENCE-FREQUENCY GENERATING CIRCUIT
11
101
102
103
111
FF
FF
FF
FF
FF
FF
FF
FF
121
122
XOR CIRCUIT
131
POPULATION COUNTER
132
COMPARATIVE-FREQUENCY GENERATING CIRCUIT
12
OSCILLATOR
13
CLK
SUBTRACTION CIRCUIT
141
ACCUMULATOR
142
DIFFERENCE CALCULATING UNIT
14
LDO-CONTROL LOGIC CIRCUIT
30

| | Ph 0 | Ph 1 | Ph 2 | Ph 3 | Ph 4 | Ph 5 | Ph 6 | Ph 7 | Ph 8 |
|---|---|---|---|---|---|---|---|---|---|
| T0 | 0 | 1 | 0 | 1 | 1 | 0 | 1 | 0 | 1 |
| T1 | 0 | 1 | 0 | 1 | 0 | 1 | 0 | 1 | 1 |
| T2 | 1 | 0 | 1 | 0 | 0 | 1 | 0 | 1 | 0 |

| | Ph 0 | Ph 1 | Ph 2 | Ph 3 | Ph 4 | Ph 5 | Ph 6 | Ph 7 | Ph 8 | Ph 9 | Ph 10 | Ph 11 | Ph 12 | Ph 13 | Ph 14 |
|---|---|---|---|---|---|---|---|---|---|---|---|---|---|---|---|
| T00 | 1 | 0 | 1 | 0 | 1 | 0 | 1 | 1 | 0 | 1 | 0 | 1 | 0 | 1 | 0 |
| T01 | 0 | 1 | 0 | 1 | 1 | 0 | 1 | 0 | 1 | 0 | 1 | 0 | 1 | 0 | 1 |
| XOR | 1 | 1 | 1 | 1 | 0 | 0 | 0 | 1 | 1 | 1 | 1 | 1 | 1 | 1 | 1 |

222

221

203
204
T
T02
T03
T02 T03 XOR
241
242
243

VOLTAGE DETECTING CIRCUIT AND INFORMATION PROCESSING APPARATUS

CROSS-REFERENCE TO RELATED APPLICATION

This application is based upon and claims the benefit of priority of the prior Japanese Patent Application No. 2023-107502, filed on Jun. 29, 2023, the entire contents of which are incorporated herein by reference.

FIELD

The embodiment discussed herein is related to a voltage detecting circuit and an information processing apparatus.

BACKGROUND

When voltage measurement is performed in a digital circuit, a ring oscillator (ROSC) is often used because of its small circuit size and easy measurement. An oscillation frequency of an ROSC varies depending on an applied voltage. Therefore, by comparing an oscillation frequency of an ROSC operating at a measurement voltage, which is a voltage to be measured, and an oscillation frequency of an ROSC operating at a target voltage to be a reference, the voltage can be detected. In this method, to calculate an oscillation frequency, the number of times of transitions of each node in the ROSC from High to Low or from Low to High in a predetermined period is counted.

Conventionally, as a technique of voltage measurement using ROSC, following methods have been proposed. For example, there is a technique in which when a result of mapping operation performed on an input frequency to an AD converter with a ring oscillator based on current inflow/outflow information of a high-voltage battery is small, an input frequency is considered low frequency, and when an absolute value is large, an input frequency is considered high frequency (For example, Japanese Laid-open Patent Publication No. 2009-268068).

However, there have been various problems with the conventional voltage measurement technique using ROSC. For example, when the number of cycles of ROSC and the number of stages of progress from a starting point in a voltage comparison period are determined setting a specific node in the ROSC as the starting point, it is reset at the time of measurement to start transmission from the node of the starting point. In this case, during the period of the reset operation, the voltage measurement is difficult. When there is a period in which the voltage measurement is difficult, there is a risk of error when the voltage is fluctuating.

Furthermore, when sampling is performed on an internal node and a cycle counter with a sampling clock and the number of stages of progress overall is determined from the difference with the previous sampling result, there is a risk of significant measurement error due to an influence of metastability occurring in the sampling of the counter.

Moreover, when a counter is arranged in each node in an ROSC and a sum of the counters is calculated to determine the number of stages in which transitions have occurred, there is a period in which voltage detection is difficult due to a reset operation of the counter. In this case also, there is a risk of error when the voltage is fluctuating if there is a period in which the voltage measurement is difficult.

In a technique of changing an input frequency to an AD converter with a ring oscillator based on current inflow/outflow information of a high-voltage battery, there is no specific consideration given to a method of acquiring an oscillation frequency of an ROSC, and there is a risk of error similarly to the conventional method. As described, in the conventional technique of voltage measurement using a ROSC, there is a risk of error in voltage measurement, and it has been difficult to measure a voltage accurately.

SUMMARY

According to an aspect of an embodiment, a voltage detection circuit includes, two ring oscillators that have a plurality of inverters arranged in series in a ring shape, a sampling unit that acquires an output signal from each of the inverters in each sampling cycle, a transition-stage calculating unit that calculates number of transition stages that is number of the inverters in which a value of an output signal has transitioned during the sampling cycle for each of the ring oscillators based on the output signal of each sampling cycle acquired by the sampling unit, and a voltage detecting unit that performs voltage detection based on the number of transition stages acquired by the transition-stage calculating unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a circuit diagram of an example of a voltage detection circuit according to an embodiment;

FIG. 4 is a diagram for explaining a method of acquiring the number of transition stages;

DESCRIPTION OF EMBODIMENT

Preferred embodiments of the present invention will be explained with reference to accompanying drawings. Embodiments below are not intended to limit the voltage detection circuit and the information processing apparatus disclosed in the present application.

Figure 1:
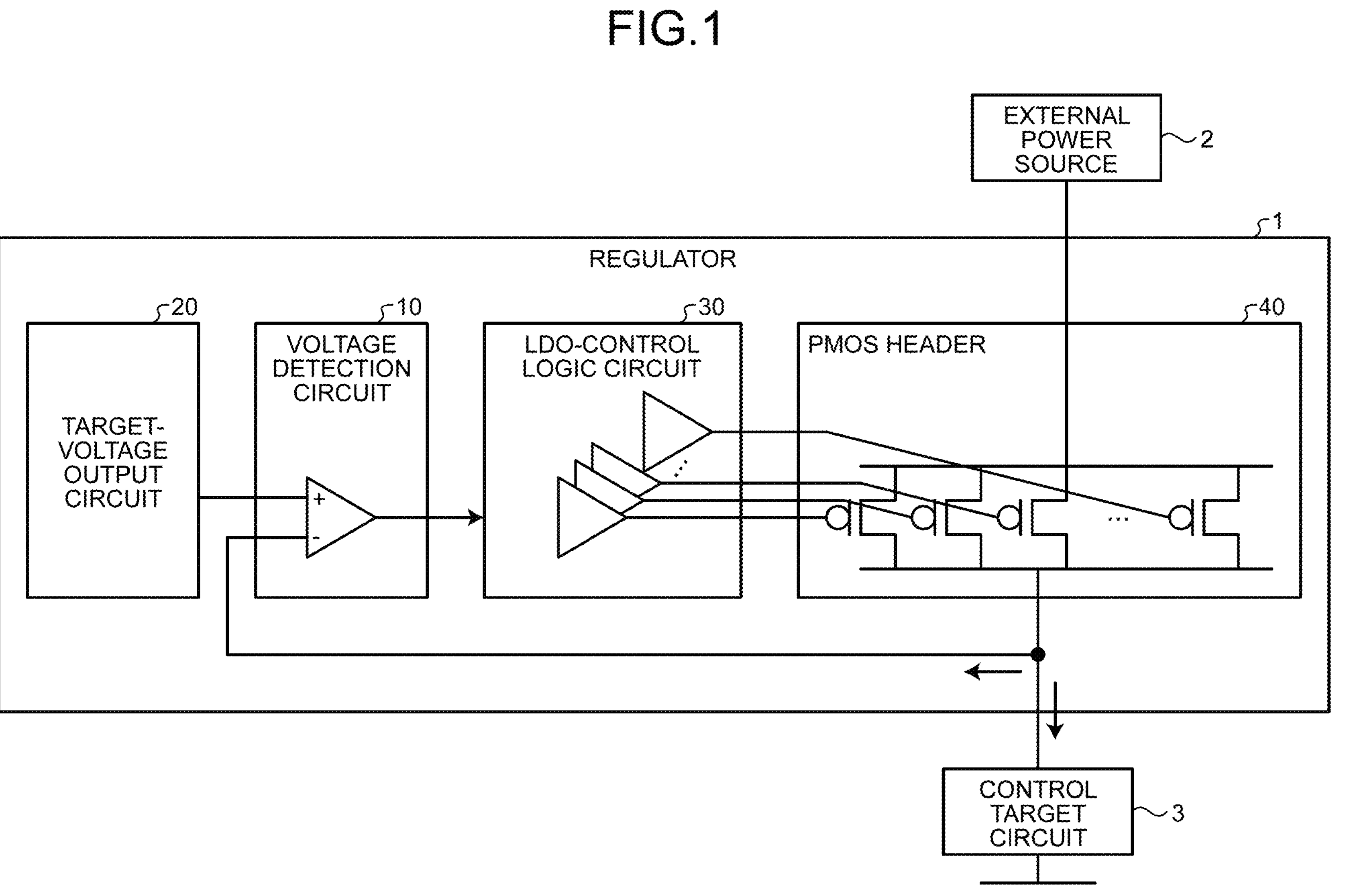
FIG. 1 is a schematic diagram of a regulator.

FIG. 1 is a schematic diagram of a regulator. A regulator 1 illustrated in FIG. 1 is a low drop out (LDO) regulator. The regulator 1 adjusts a voltage from a power source supplied from an external power source 2 into a specified lower voltage, to supply to a control target circuit 3. As illustrated in FIG. 1, the regulator 1 includes a voltage detection circuit 10, a target-voltage output circuit 20, an LDO-control logic circuit 30, and a P-channel metal oxide semiconductor (PMOS) header 40.

The external power source 2 inputs a power to be used for operation of the control target circuit 3 to the regulator 1. A voltage value of the power output from the external power source 2 is higher than a voltage value to operate the control target circuit 3.

The control target circuit 3 is, for example, a central processing unit (CPU). The control target circuit 3 operates by using the power supplied from the external power source 2 as its power source. More specifically, the control target circuit 3 receives an input of power subjected to voltage value adjustment from the regulator 1. The control target circuit 3 operates with the input power as its power source.

The target-voltage output circuit 20 has information about a constant voltage value set in advance. The target-voltage output circuit 20 outputs a target voltage having the set voltage value.

The voltage detection circuit 10 receives the target voltage from the target-voltage output circuit 20. Moreover, the voltage detection circuit 10 receives input of a feedback output voltage from the PMOS header 40. The voltage detection circuit 10 compares the output voltage from the PMOS header 40 and the target voltage, to calculate the difference in voltage values. Thereafter, the voltage detection circuit 10 outputs the calculated difference in voltage value to the LDO-control logic circuit 30.

The LDO-control logic circuit 30 receives input of the difference in voltage value between the output voltage from the PMOS header 40 and the target voltage from the voltage detection circuit 10. The LDO-control logic circuit 30 determines ON or OFF of respective transistors included in the PMOS header 40 to decrease the acquired difference in voltage value. The LDO-control logic circuit 30 outputs a signal to the respective PMOS transistors of the PMOS header 40 to bring them into a determined ON or OFF state. This LDO-control logic circuit 30 corresponds to an example of "voltage control circuit".

The PMOS header 40 includes multiple PMOS transistors arranged in parallel. The PMOS header 40 achieves variable resistance by changing a ratio of on-off states of the PMOS transistors. In the PMOS header 40, the respective PMOS transistors become ON or OFF based on the signal input from the LDO-control logic circuit 30. The PMOS header 40 receives input of power from the external power source 2 in a state in which the respective PMOS transistors are controlled to be ON or OFF. The PMOS header 40 outputs power adjusted by the on-off states of the PMOS transistor to the control target circuit 3.

FIG. 2 is a circuit diagram of an example of the voltage detection circuit according to the embodiment. The voltage detection circuit 10 includes a reference-frequency generating circuit 11, a comparative-frequency generating circuit 12, an oscillator 13, and a difference calculating unit 14.

The reference-frequency generating circuit 11 receives input of a target voltage, and outputs an oscillation frequency corresponding to the target voltage. Hereinafter, the oscillation frequency corresponding to the target voltage is referred to as "reference frequency". The comparative-frequency generating circuit 12 receives input of a feedback output voltage from the PMOS header 40, and outputs an oscillation frequency corresponding to the output voltage from the PMOS header 40. Hereinafter, the oscillation frequency corresponding to the output voltage from the PMOS header 40 is referred to as "comparative frequency".

The reference-frequency generating circuit 11 and the comparative-frequency generating circuit 12 have similar configurations. Therefore, the reference-frequency generating circuit 11 will be explained in detail as an example.

The reference-frequency generating circuit 11 includes, as illustrated in FIG. 2, an ROSC 101, a sampling mechanism 102, and a transition counting mechanism 103.

The ROSC 101 includes an odd number of inverters 111 connected in series. In the ROSC 101, output of the inverter 111 at the final stage is input to the inverter 111 at the first stage. The respective inverters 111 outputs a signal having a logic opposite to an input signal sequentially to the inverter 111 in a subsequent stage. That is, when a signal having a value of High is input, the inverter 111 outputs a signal having a value of Low to the inverter 111 of the subsequent stage. Inversely, when a signal having a value of Low is input, a signal having a value of High is output to the inverter 111 of the subsequent stage. The signal having a value of High is called "High signal" and a signal having a value of Low is called "Low signal". The ROSC 101 of the reference-frequency generating circuit 11 corresponds to an example of "first ring oscillator", and the ROSC 101 of the comparative-frequency generating circuit 12 corresponds to an example of "second ring oscillator".

Because the number of the inverters 111 connected is an odd number, a next input signal is a signal with a logic opposite to that of an immediate previous signal in each of the inverters 111. That is, in the respective inverters 111, signals with opposite logics are input alternately, and signals with opposite logics are output alternately. Thus, the ROSC 101 oscillates. In the ROSC 101, an oscillation frequency is generated based on a period from input of one signal until input of a next signal in the specific inverter 111. Accordingly, the respective inverters 111 output signals with different logics for each oscillation cycle. The inverter 111 included in the ROSC 101 of the reference-frequency generating circuit 11 corresponds to an example of "first inverter", and the inverter 111 included in the ROSC 101 of the comparative-frequency generating circuit 12 corresponds to an example of "second ring oscillator".

The sampling mechanism 102 receives input of a system clock (CLK) from the oscillator 13. The sampling mechanism 102 includes the same number of flip flop (FF) 121 as the inverters 111. Moreover, the sampling mechanism 102 of the reference-frequency generating circuit 11 corresponds to an example of "first sampling mechanism", and the sampling mechanism 102 of the comparative-frequency generating circuit 12 corresponds to an example of "second sampling mechanism".

In the FF 121, respective input terminals are connected to respective routes connecting an output of each of the inverters 111 and an input of the inverter 111 in the following stage. Moreover, in each of the FFs 121, an output terminal branches, and one branch is connected to the input terminal of the FF 122, and the other branch is connected to an XOR circuit 131 of the transition counting mechanism 103.

To the FF 121, an output signal from the respective inverters 111 is input every clock cycle following the system clock. An edge of the system clock is the sampling timing of the FF 121. Moreover, the cycle of the system clock is the sampling cycle of the sampling mechanism 102. Following the system clock input from the oscillator 13, the FF 121 outputs the input signal from each inverter to the FF 122 and the XOR circuit 131 after one clock cycle.

Among the output signals acquired by the FF 121 in sampling timing, a segment between the inverter 111 that has output an output signal having a value that has transitioned finally in the sampling cycle and the following inverter 111 is referred to as "edge" of transition of a value of the output signal. That is, in the subsequent sampling cycle, a value transitions from an output signal of the inverter 111 subsequent to the edge.

In the FF 122, each input terminal is connected to an output terminal of the FF 121. Moreover, in the FF 122, each output terminal is connected to the XOR circuit 131 of the transition counting mechanism 103.

To the FF 122, a signal of an output signal output from the inverter 111 is input with a delay of one clock cycle from the FF 121. The FF 122 outputs an input signal from each inverter to the FF 122 and the XOR circuit 131 after one clock cycle.

As described, the FF 122 adds a one-clock delay to the output signal from the clock. That is, to the XOR circuit 131, a signal sampled by the FF 121 in one sampling cycle, and a signal sampled by the FF 121 in a sampling cycle that is one cycle previous to that are input.

The sampling cycle is preferable to be larger than two times the oscillation frequency. That is, it is preferable that (sampling cycle/2)>oscillation frequency be satisfied. For example, in the case of (sampling cycle/2)=oscillation frequency, a signal held by the FF 122 has a value opposite to a signal held by the FF 121 in the sampling timing. Moreover, in the case of (sampling cycle/2)<oscillation frequency, the edge causes the ROSC 101 to complete more than one cycle within the sampling cycle, and some of the inverters 111 have output transitions more than two times.

Figure 3:
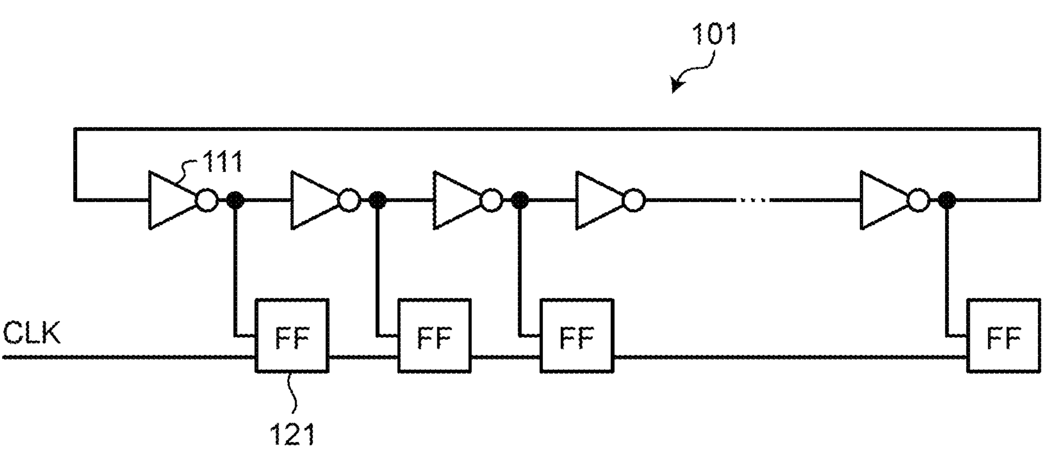
FIG. 3 is a diagram illustrating an internal state of an ROSC.
Figure 3:
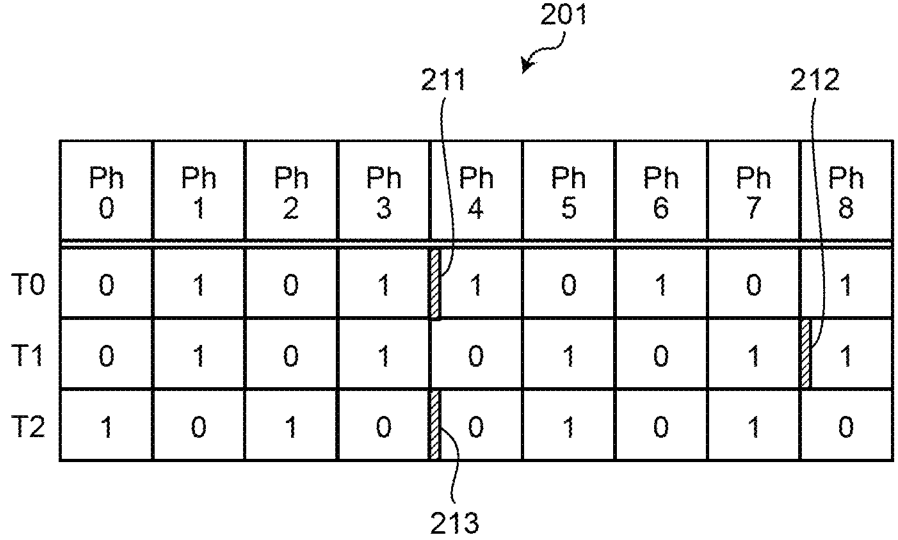

FIG. 3 is a diagram illustrating an internal state of the ROSC. In an upper part of the sheet, the ROSC 101 and the FF 121 are schematically illustrated. Moreover, a table 201 in a lower part of the sheet provide a time T0, a time T1, which is one clock cycle after the time T0, and a value of a signal store in the FF 121 at T2, which is one clock cycle after the time T1. An example in which nine units of the inverters 111 and the FFs 121 are aligned will be explained. Specifically, Pho in the table 201 represents a value of a signal held by the FF 121 at the head, Ph2 to Ph7 sequentially represent values held by the FF 121 in each subsequent stage, and Ph8 represents a value held by the FF 121 at the final stage. The top FF 121 receives input of a system clock (CLK).

For example, values of signals sampled at the respective FF 121 at the time T0 are "0, 1, 0, 1, 1, 0, 1, 0, 1" from the top FF 121 toward the subsequent stages. The edge of the signal at the time T0 is a position 211 between the FF 121 of Ph3 and the FF 121 of Ph4. The signal having a value 1 corresponds to the signal of High, and the signal having a value 0 corresponds to the signal of LOW.

Values of signals sampled at the time T1, which is one sampling cycle later, are "0, 1, 0, 1, 0, 1, 0, 1, 1" from the top FF 121 toward the subsequent stages. The edge of the signal at the time T1 is a position 212 between the FF 121 of Ph7 and the FF 121 of Ph8. That is, the signal moves from the FF 121 of Ph4 to the FF 121 of Ph7 by four stages of the inverters 111 within a single sampling cycle.

Furthermore, values of signals sampled at the time T2, which is one sampling cycle later, are "1, 0, 1, 0, 0, 1, 0, 1, 0" from the top FF 121 toward the subsequent stages. The edge of the signal at the time T2 is a position 213 between the FF 121 of Ph3 and the FF 121 of Ph4. That is, the signal moves from the FF 121 of Ph8 to the FF 121 of Ph3 by five stages of the inverters 111 within a single sampling cycle.

When this table is replaced with the values of the signals held by the FF 121 and the FF 122, the FF 122 holds the signals at the time T0 while the FF 121 holds the signals at the time T1. Moreover, the FF 122 holds the signals at the time T1 in a state in which the FF 121 holds the signals at the time T2.

The transition counting mechanism 103 includes the XOR circuit 131 and a population counter 132. The transition counting mechanism 103 of the reference-frequency generating circuit 11 corresponds to an example of "first transition-stage counting mechanism", and the transition counting mechanism 103 of the comparative-frequency generating circuit 12 corresponds to an example of "second transition-stage counting mechanism".

The XOR circuit 131 receives input of a signal sampled by the FF 121 in the latest sampling cycle from the FF 121. Moreover, the XOR circuit 131 receives a signal sampled by the FF 121 in the sampling cycle one cycle previous thereto from the FF 122.

The XOR circuit 131 calculates an exclusive OR of the signal sampled by the FF 121 in the latest sampling cycle and the signal sampled by the FF 121 in the sampling cycle one cycle previous thereto, for each of the FF 121. The XOR circuit 131 outputs a calculated arithmetic result to the population counter 132.

The population counter 132 receives input of the arithmetic result of the exclusive OR of the signal sampled by the FF 121 in the latest sampling cycle and the signal sampled by the FF 121 in the sampling cycle one cycle previous thereto for each of the FF 121 from the XOR circuit 131. The population counter 132 counts the number of 1s out of the arithmetic results of the XOR circuit 131.

In other words, the population counter 132 acquires the number of the FFs 121 having different values between the signal sampled in the latest sampling cycle and the signal sampled in the sampling cycle one cycle previous thereto. That is, the number counted by the population counter can be regarded as the number of the FFs 121 in which the value of the signal held therein has transitioned, and corresponds to the number of stages of the inverters 111 in which the value of the output signal has transitioned. In the following, the number of stages of the inverters 111 in which the value of the output signal has transitioned is referred to as "number of transition stages of the inverter 111". Thereafter, the population counter 132 outputs the number of count to the difference calculating unit 14.

FIG. 4 is a diagram for explaining a method of acquiring the number of transition stages. An example in which 15 units of the inverters 111 and the FFs 121, 122 are aligned will be explained herein. For example, at a time T00 and the time T01, the FFs 121 have signals of values indicated in Table 202. In this case, the signal at the time 00 is input to the XOR circuit 131 from the FF 122 when the signal at the time T01 is input to the XOR circuit 131 from the FF 121.

Arithmetic results obtained by the XOR circuit 131 are values indicated on the bottom row of Table 202. In this case, a range 221 in which the values are 1 corresponds to the FFs 121 in which the signal has changed, and a range 222 in which the values are 0 corresponds to the FFs 121 in which the signal does not change.

In this case, the population counter 132 counts the number 1s as 12. That is, it can be regarded that the number of the FFs 121 in which the value of the signal has changed is 12, and the output of 12 stages of the inverters 111 has transitioned.

Figure 5:
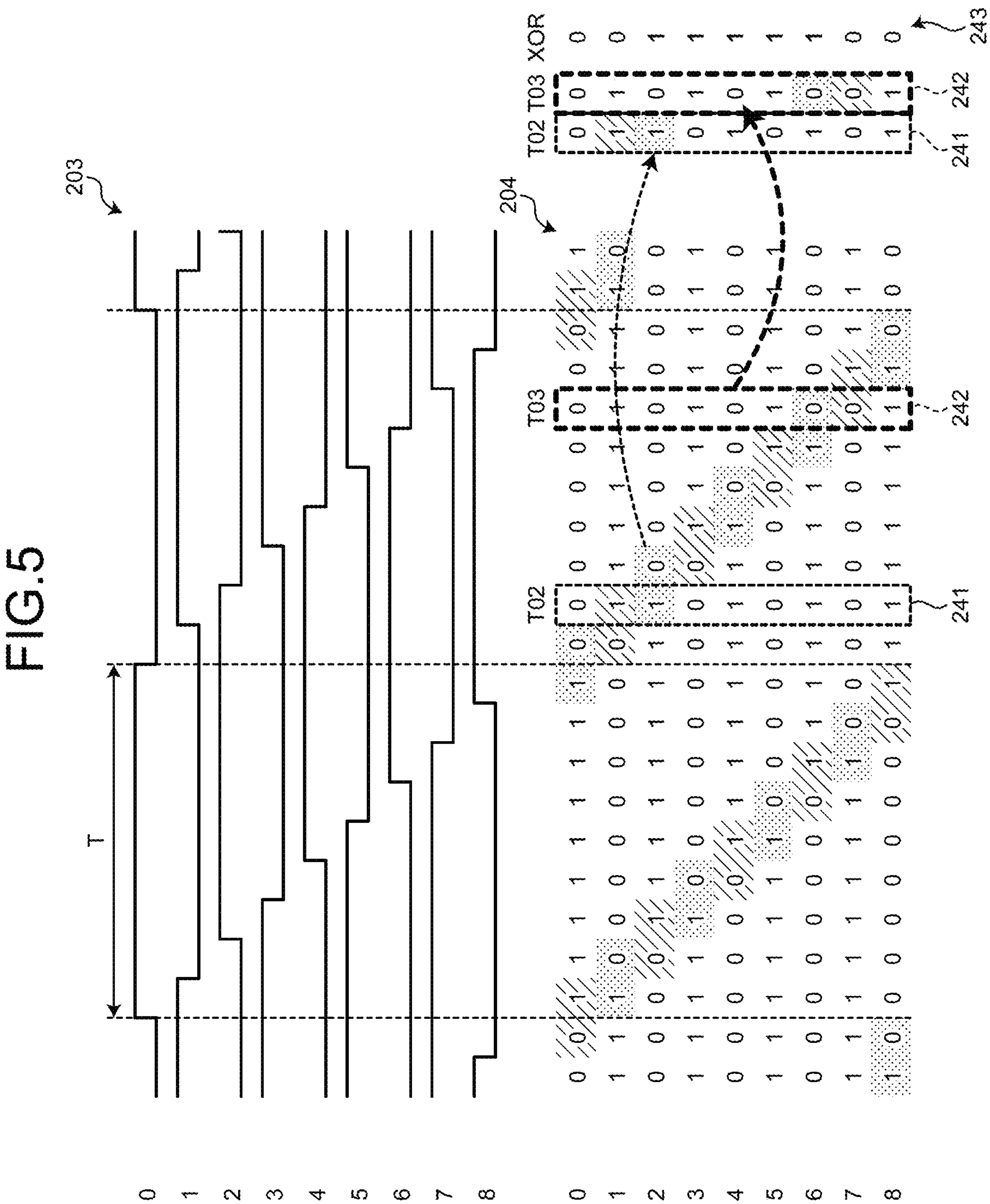
FIG. 5 is a timing chart illustrating a changes of signals and a sampling result.

FIG. 5 is a timing chart indicating changes of signals and sampling results. A graph 203 in FIG. 5 represents changes of signals output from the inverters 111. Moreover, a graph 204 represents signals stored in the FFs 121. In the graph 203, a horizontal axis represents elapsed time, and a vertical axis represents the inverters 111 of the respective stages. An example in which nine units of the inverters 111 are connected will be explained herein. Moreover, an example in which numbers from 0 to 8 indicated on a left side of the sheet in the graph 203 are assigned to the respective inverters 111 will be explained.

In the graph 204, a horizontal axis represents elapsed time, and a vertical axis represents the FFs 121 corresponding to the inverters. The respective FFs 121 store output signals from the inverters 111 to which the same numbers as the numbers indicated on the left side on the sheet in the graph 204 are assigned. That is, the FF 121 to which 0 is assigned stores the output signal from the inverter 111 to which 0 is assigned.

A time T in the graph 203 represents an oscillation cycle. Moreover, in the graph 204, a position between sections hatched with diagonal line patterns and sections hatched with dot patterns indicates a position in which the edge of the signal in that timing is present. One cycle in which the edge passes through the inverters 111 coincides with the oscillation cycle T.

For example, at a time T02, the respective FFs 121 hold a signal group 241. Moreover, at a time T03, the respective FFs 121 hold the signal group 241. For example, a case in which the time T02 is the sampling timing and the time T03 is a sampling timing in a sampling cycle subsequent to the time T02 will be explained.

In this case, the signal group 241 is input to the XOR circuit 131 from the F 121. Moreover, a signal group 242 is input to the XOR circuit 131 from the FF 122. In this case the XOR circuit 131 outputs a numerical value group 243. Receiving input of the numerical value group 243, the population counter 132 counts the number of 1s as five. That is, the number of stages of the inverters 111 in which the output acquired from the counter of the population counter 132 is five, and this coincides with the number of the inverters 111 in which the edge has moved from the time T02 to the time T03 in the graphs 203 and 204.

As described, the number output from the population counter 132 can be regarded as the number of transition stages of the inverter 111 during the sampling cycle. The number output from the population counter 132 represents an oscillation frequency of the ROSC 101.

In summary, when a specific sampling cycle is specific cycle and a sampling cycle one cycle previous to the specific cycle is previous cycle, it is regarded that the transition counting mechanism 103 performs following processing. That is, the transition counting mechanism 103 counts the number of inverters 111 in the ROSC 101 from the inverter 111 in which the value of the output signal has changed finally in the previous cycle to the invertor 111 in which the value of the output signal has changed finally in the specific cycle, to determine as the number of transition stages.

The difference calculating unit 14 calculates a difference between a reference frequency and a comparative frequency during a measurement period. The difference calculating unit 14 includes a subtraction circuit 141 and an accumulator 142. This difference between the reference frequency and the comparative frequency indicates a difference between referred voltages, and calculation of a difference between the reference frequency and the comparative frequency corresponds to an example of "detection of voltage". The difference calculating unit 14 corresponds to an example of "voltage detecting unit".

The difference calculating unit 14 receives input of the number of transition stages of the inverters 111 in the sampling cycle when the target voltage is input from the reference-frequency generating circuit 11. Moreover, the difference calculating unit 14 receives input of number of transition stages of the inverters 111 in the sampling cycle when the output voltage from the PMOS header 40 is input from the comparative-frequency generating circuit 12.

Next, the difference calculating unit 14 subtracts the number of transition stages of the inverter 111 input from the comparative-frequency generating circuit 12 from the number of transition stages of the inverters 111 input from the reference-frequency generating circuit 11, to calculate the difference in the number of transition stages. The difference calculating unit 14 outputs the calculated difference in the number of transition stages to the accumulator 142. The difference calculating unit 14 repeats calculation of the difference in the number of transition stages in the measurement period, to sequentially output to the accumulator 142.

The accumulator 142 receives input of the difference in the number of transition stages from the difference calculating unit 14. The accumulator 142 accumulates the differences in the number of transition stages until the measurement period ends, and adds up all of them. Thereafter, the accumulator 142 outputs an addition result to the LDO-control logic circuit 30.

Figure 6:
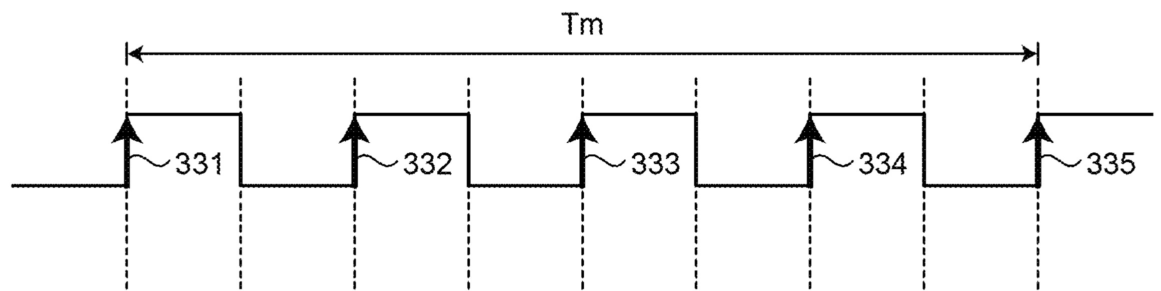
FIG. 6 is a diagram for explaining absorption of an error in the voltage detection circuit according to the embodiment.

FIG. 6 is a diagram for explaining error absorption in the voltage detection circuit according to the embodiment. For example, a case in which a measurement period Tm is a period for four sampling cycles will be explained. In this case, during the measurement period Tm, sampling is performed in timings 331 to 335.

An error can occur at a point at which the sampling frequency and an edge of a ring collide due to metastability. In that case, a value of the output signal at the sampling is determined statistically. For example, when an error occurs due to metastability in the timing 333, the error that occurs in the sampling in the timing 333 is absorbed with the remaining probability by the sampling in the timing 334. Because the accumulator 142 adds up the differences in the measurement period Tm, for example, when the signal transitions to 1, it depends on which of the cycles out of the timing 333 and the timing 334, the sampling is counted as 1, and the error becomes imperceptible in the end. That is, by addition of the differences in the measurement period by the accumulator 142, an error that occurs in the timings 332 to 334 is hidden and, therefore, occurrence of errors is limited to sampling at the start in an initial stage and sampling at the end in a final stage. As described, the voltage detection circuit 10 according to the embodiment can minimize the measurement error.

Figure 7:
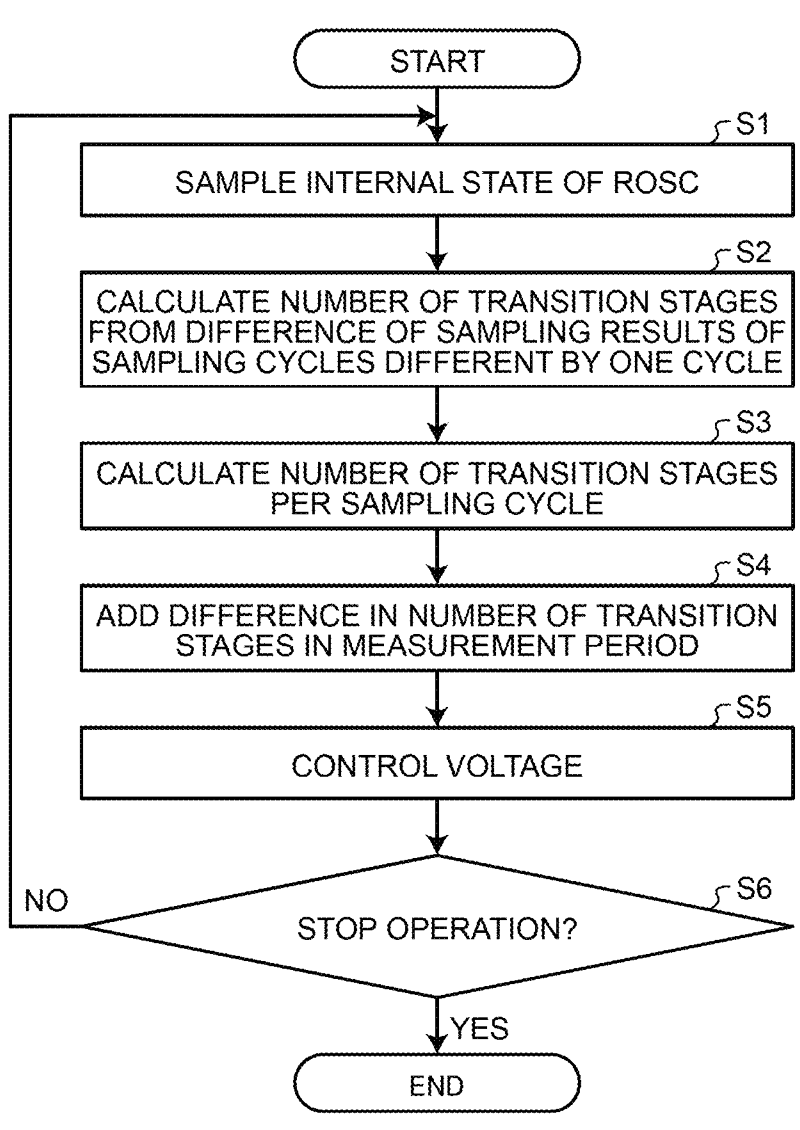
FIG. 7 is a flowchart of voltage detection processing.

FIG. 7 is a flowchart of the voltage detection processing. Next, a flow of the voltage detection processing by the voltage detection circuit 10 according to the present embodiment will be explained referring to FIG. 7.

The ROSC 101 of the reference-frequency generating circuit 11 oscillates, receiving input of a voltage from the external power source 2. Moreover, the ROSC 101 of the comparative-frequency generating circuit 12 oscillates, receiving input of an output voltage from the PMOS header 40. Both in the reference-frequency generating circuit 11 and the comparative-frequency generating circuit 12, the sampling mechanism 102 samples an internal state of the oscillating ROSC 101 in sampling cycles determined by the system clock by using the FFs 121 and 122 (step S1).

The XOR circuit 131 of the transition counting mechanism 103 receives input of signals output from the respective inverters 111 from the respective FF 121 and the FF 122. The XOR circuit 131 calculates an exclusive OR or the signal input from the respective FFs 121 and the signal input from the corresponding FFs 122. The population counter 132 calculates the number of transition stages by counting the number of values being 1 out of results of the exclusive OR obtained by the XOR circuit 131. Thus, the transition counting mechanism 103 calculates the number of transition stages from the difference between sampling results of sampling cycles that differ by one cycle (step S2).

A subtraction circuit 141 of the difference calculating unit 14 receives input of the number of transition stages for each sampling cycle from the reference-frequency generating circuit 11 and the comparative-frequency generating circuit 12. The subtraction circuit 141 subtracts the number of transition stages input from the comparative-frequency generating circuit 12 from the number of transition stages input from the reference-frequency generating circuit 11, to calculate the difference of transition stages per sampling cycle (step S3).

The accumulator 142 of the difference calculating unit 14 receives input of the difference in the number of transition stages of each sampling cycle in the measurement period from the subtraction circuit 141. The accumulator 142 adds the difference in the number of transition stages in the measurement period (step S4).

The accumulator 142 outputs the addition result of the differences in the number of transitions in the measurement period to the LDO-control logic circuit 30. The LDO-control logic circuit 30 performs control logic operation using the addition result of the differences of the number of transition stages in the measurement period, and determines ON or OFF of the respective PMOS transistors included in the PMOS header 40. The LDO-control logic circuit 30 applies a voltage to the respective PMOS transistors according to the determined ON and OFF, to control a voltage to be output to the control target circuit 3 (step S5).

Thereafter, the voltage detection circuit 10 determines whether to stop the operation based on whether an instruction to turn off the power of the system has been received (step S6). When the operation is not to be stopped (step S6: NO), the voltage detection circuit 10 returns to step S1. On the other hand, when the operation is to be stopped (step S6: YES), the voltage detection circuit 10 ends the voltage detection processing.

Figure 8:
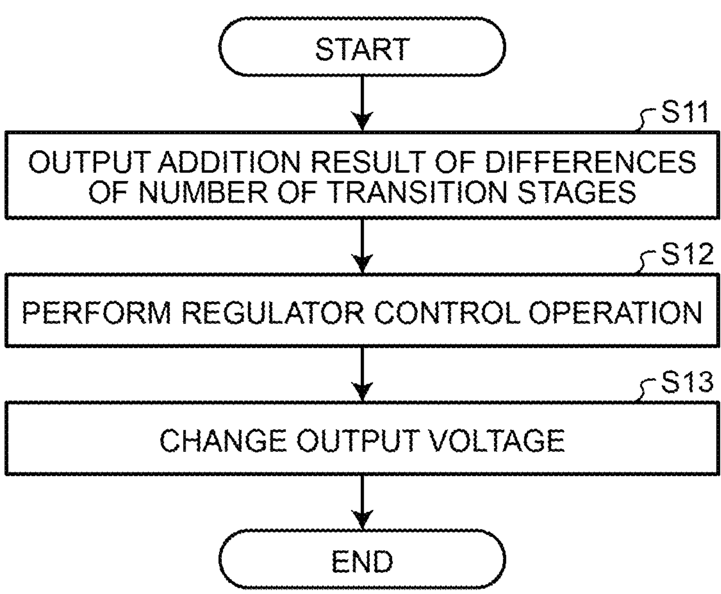
FIG. 8 is a flowchart of voltage control.

FIG. 8 is a flowchart of voltage control. Respective processing in the flow described in FIG. 8 correspond to an example of processing performed at step S5 of FIG. 7. Next, a flow of the voltage control will be briefly explained referring to FIG. 8.

The voltage detection circuit 10 outputs the addition result of the differences of the number of transition stages in the measurement period to the LDO-control logic circuit 30 (step S11).

The LDO-control logic circuit 30 receives input of the calculation result of the difference in the number of transition stages in the measurement period from the voltage detection circuit 10. Next, the LDO-control logic circuit 30 performs regulator control operation (step S12).

Thereafter, the LDO-control logic circuit 30 determines ON or OFF of the respective PMOS transistors included in the PMOS header 40 such that an adjustment amount obtained by the regulator control operation is achieved. The LDO-control logic circuit 30 applies a voltage to the respective PMOS transistors according to the determination. The PMOS header 40 changes its output voltage as the ON and OFF states are of the respective PMOS transistors are controlled by the LDO-control logic circuit 30 (step S13).

Next, a specific example of the voltage control based on the regulator control operation by the LDO-control logic circuit 30 and its operation result will be specifically explained. A case in which a difference is reflected as it is to the number of PMOS transistors to be ON will be explained herein. The number of the PMOS transistors that are in an ON state at the time of control is 50 in this example.

For example, the LDO-control logic circuit 30 acquires 10 as an addition result of differences in the number of transition stages in the measurement period. In this case, because the number of transition stages of the inverters 111 input from the reference-frequency generating circuit 11 is larger, it is considered that the output voltage from the PMOS header 40 is lower than the target voltage. Therefore, the LDO-control logic circuit 30 determines to increase the number of the PMOS transistors to be ON to increase the output voltage from the PMOS header 40. The LDO-control logic circuit 30 adds 10, which is the addition result of the differences of the transition stages, to 50 that is the number of the PMOS transistors that are currently in the ON state, to change the number of the PMOS transistors to be ON to 60. Thereafter, the LDO-control logic circuit 30 applies a voltage to the respective PMOS transistors of the PMOS header 40 such that the number of the PMOS transistors to be in the ON state becomes 60.

Next, the LDO-control logic circuit 30 acquires 5 as an addition result of the differences in the number of transition stages in the measurement period. In this case also, because the number of transition stages of the inverters 111 input from the reference-frequency generating circuit 11 is larger, it is considered that the output voltage from the PMOS header 40 is lower than the target voltage. Therefore, the LDO-control logic circuit 30 determines to increase the number of the PMOS transistors to be ON to increase the output voltage from the PMOS header 40. The LDO-control logic circuit 30 adds 5, which is the addition result of the differences of the transition stages, to 60 that is the number of the PMOS transistors that are currently in the ON state, to change the number of the PMOS transistors to be ON to 65. Thereafter, the LDO-control logic circuit 30 applies a voltage to the respective PMOS transistors of the PMOS header 40 such that the number of the PMOS transistors to be in the ON state becomes 65.

Next, the LDO-control logic circuit 30 acquires −2 as an addition result of the differences in the number of transition stages in the measurement period. In this case, because the number of transition stages of the inverters 111 input from the comparative-frequency generating circuit 12 is larger, it is considered that the output voltage from the PMOS header 40 is higher than the target voltage. Therefore, the LDO-control logic circuit 30 determines to decrease the number of the PMOS transistors to be ON to decrease the output voltage from the PMOS header 40. The LDO-control logic circuit 30 adds −2, which is the addition result of the differences of the transition stages, to 65 that is the number of the PMOS transistors that are currently in the ON state, to change the number of the PMOS transistors to be ON to 63. Thereafter, the LDO-control logic circuit 30 applies a voltage to the respective PMOS transistors of the PMOS header 40 such that the number of the PMOS transistors to be in the ON state becomes 63.

Figure 9:
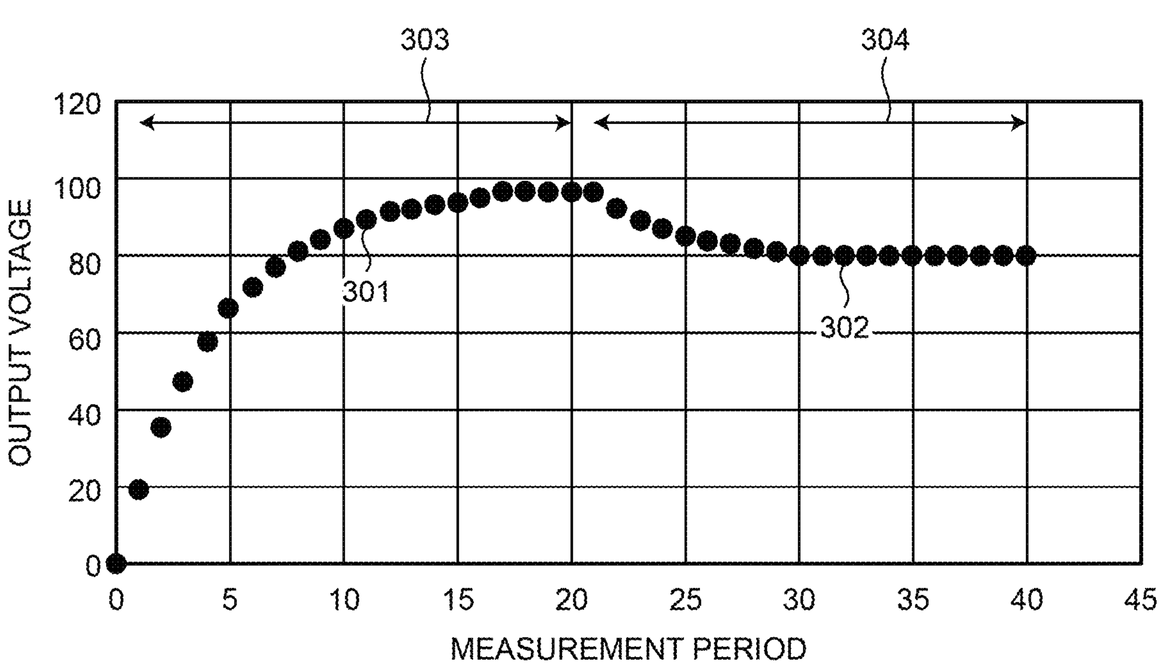
FIG. 9 is a diagram illustrating an example of a control result by the voltage control using the voltage detection circuit according to the embodiment.

The LDO-control logic circuit 30 repeats the processing as described above, and continues the control so that a difference between the number of transition stages of the reference-frequency generating circuit 11 and the number of transition stages of the comparative-frequency generating circuit 12 is approximated to 0. FIG. 9 is a diagram illustrating an example of the control result by the voltage control using the voltage detection circuit according to the embodiment. A convergence process of voltage in a simplified model will be explained referring to FIG. 9.

For simplification, it will be explained supposing that a period of the control using an addition result of differences in the number of transition stages output from the voltage detection circuit 10 and a change of the output voltage is the same period of time as one measurement period. Moreover, as the voltage control with respect to the PMOS header 40, a general integral (I) control is executed. Furthermore, although a voltage usually changes by controlling the PMOS header 40 based on an operation result by the LDO-control logic circuit 30, in this example, the operation result and the output voltage are assumed to be equal to each other. A value obtained by multiplying a difference between the output voltage of the PMOS header 40 and the target voltage by a coefficient is assumed to be a difference of the detection circuit.

In FIG. 9, a horizontal axis represents a measurement period, and a vertical axis represents an output voltage of the PMOS header 40. In a period 303, the target voltage is 100 V, and in a subsequent period 304, the target voltage is 80 V.

Because the target voltage in the period 303 is 100 V, by repeating the voltage control by the LDO-control logic circuit 30, the output voltage of the PMOS header 40 becomes closer to 100 V as indicated in a curve 301. Thereafter, when the target voltage varies to 80 V, by repeating the voltage control by the LDO-control logic circuit 30, the output voltage of the PMOS header 40 transitions from 100 V to 80 V as indicated in a curve 302.

Figure 10:
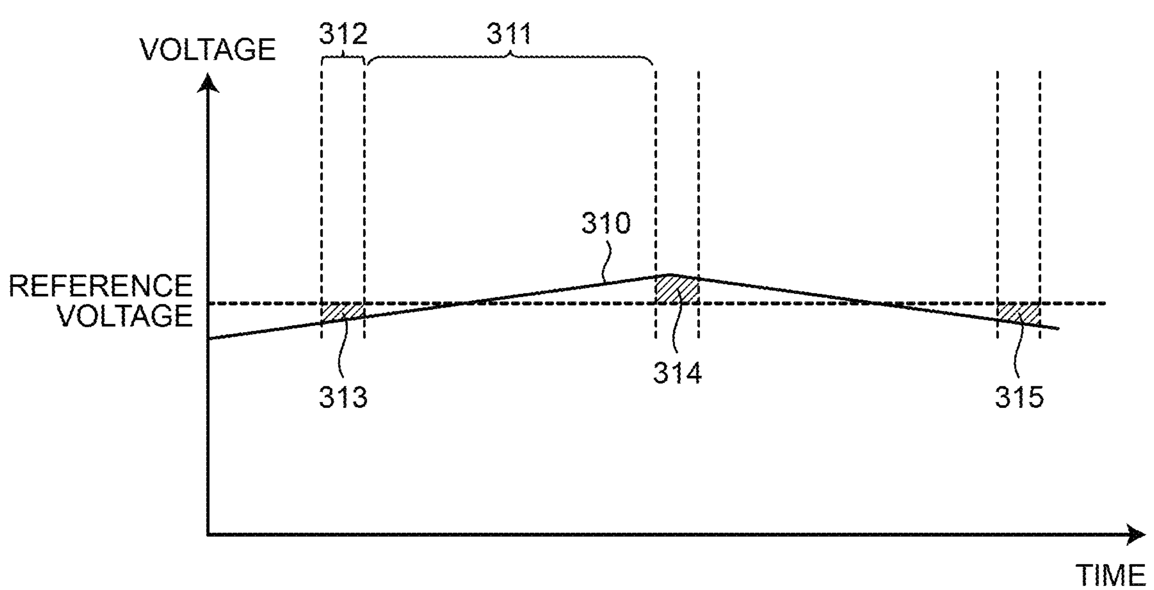
FIG. 10 is a diagram for explaining reduction in detection accuracy when there is a period in which the voltage detection is disabled.
Figure 11:
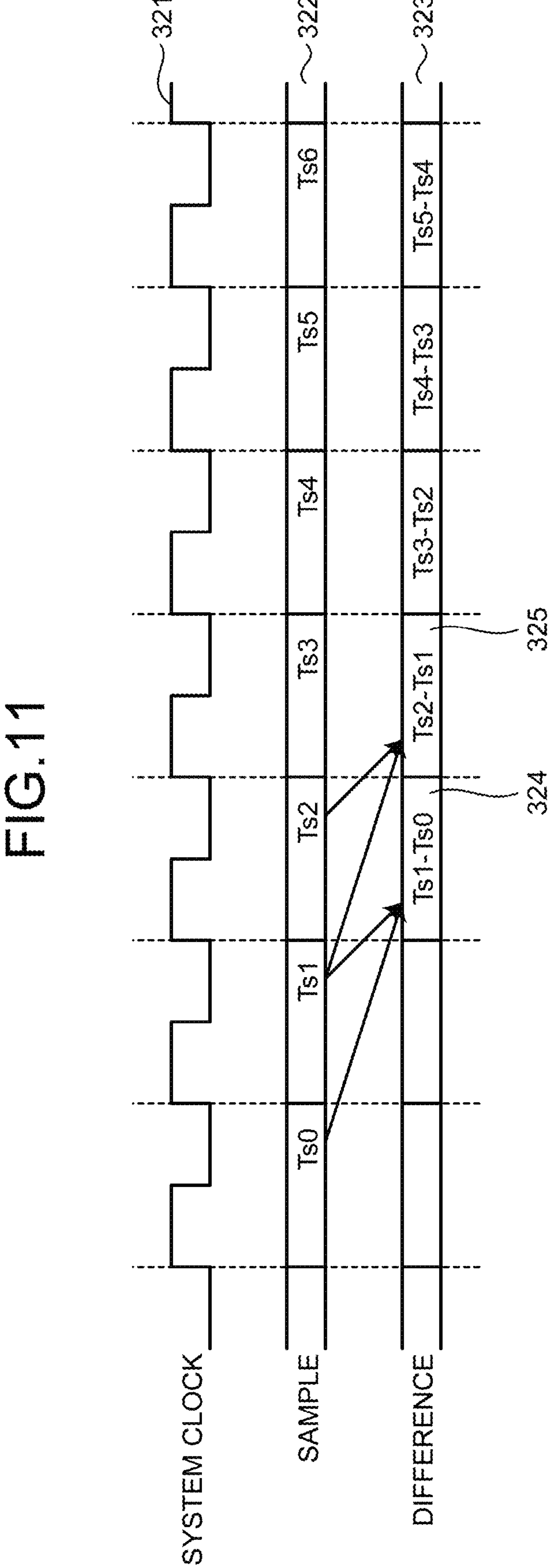
FIG. 11 is a diagram illustrating a sampling timing by the voltage detection circuit according to the embodiment.

Voltage detection accuracy by the voltage detection circuit 10 according to the present embodiment will be explained, comparing with a case of having a period of time in which voltage detection is disabled. FIG. 10 is a diagram for explaining reduction in the detection accuracy when there is a period of time in which the voltage detection is disabled. In FIG. 10, a horizontal axis represents elapsed time, and a vertical axis represents a voltage. A graph 310 indicates a change of a measurement voltage. Moreover, FIG. 11 is a diagram illustrating sampling timing by the voltage detection circuit according to the embodiment. A graph 321 in FIG. 11 indicates a system clock, a graph 322 indicates sampling cycles following the clock and samples acquired by sampling, and a graph 323 indicates differences of sampling results shifted by one cycle. In the graphs 321 to 323 in FIG. 11, as it progresses rightward on the sheet, time elapses.

For example, when a inverter to be the starting point of operation at the time of measurement in the ROSC or when a counter is arranged corresponding to each inverter, reset of the ROSC or reset of the counter is performed. When such a reset operation is performed, for example, a reset period 312 is included together with a measurement execution period 311, before the measurement execution period 311 in the measurement period as illustrated in FIG. 10. Because the voltage detection processing is not performed in this reset period 312, measurement errors 313 to 315 are included in results of voltage measurement performed in the measurement period.

On the other hand, the voltage detection circuit 10 according to the present embodiment acquires samples successively following the system clock of the graph 321 as illustrated in FIG. 11. The voltage detection circuit 10 has no periods in which samples are not acquired during the measurement period.

The voltage detection circuit 10 acquires samples Ts1 to Ts6 indicated in the graph 322 in each sampling cycle. The voltage detection circuit 10 calculates a difference of samples of cycles shifted by one cycle indicated in the graph 323. For example, the voltage detection circuit 10 calculates a difference 324 by subtracting Ts0 from Ts1, calculates a difference 325 by subtracting Ts1 from Ts2, and repeats calculation of a difference thereafter also. As described, the voltage detection circuit 10 can calculate the differences continuously without any intervals in the measurement period.

Because the number of transition stages indicated in the graph 323 can be acquired, the voltage detection circuit 10 has no period in which voltage detection is not performed. Therefore, with the voltage detection circuit 10, the errors 313 to 315 illustrated in FIG. 10 do not occur, and it is possible to improve the detection accuracy in voltage detection compared to the case having a period in which the voltage detection is disabled.

Figure 12:
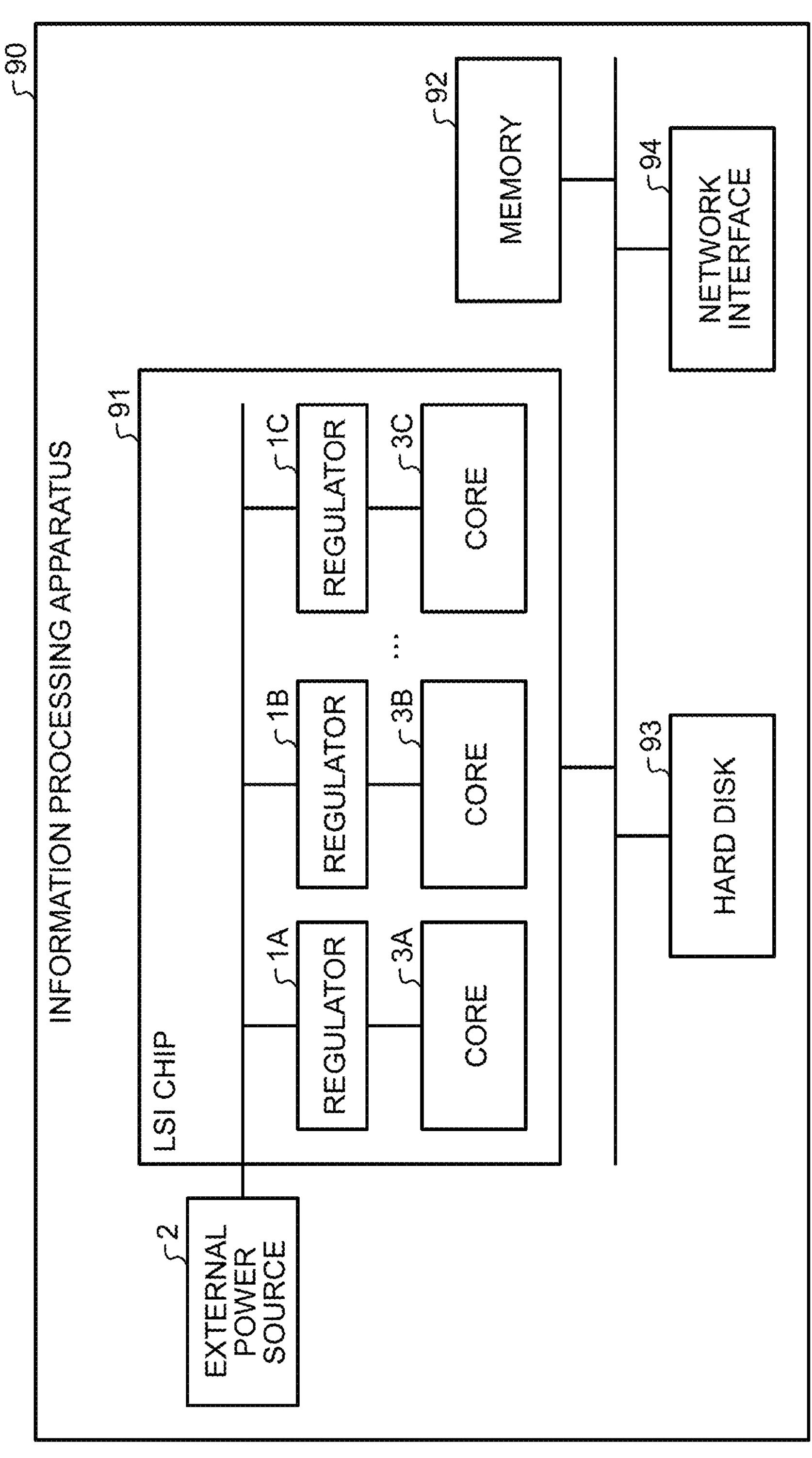
FIG. 12 is a diagram illustrating an example of an information processing apparatus using the voltage detection circuit according to the embodiment.

FIG. 12 is a diagram illustrating an example of an information processing using the voltage detection circuit according to the embodiment. Next, an example of the information processing apparatus using the voltage detection circuit 10 will be explained referring to FIG. 12.

For example, the voltage detection circuit 10 can be used for an information processing apparatus 90 illustrated in FIG. 12. The information processing apparatus 90 includes the external power source 2, a large scale integration (LSI) chip 91, a memory 92, a hard disk 93, and a network interface 94. The LSI chip 91 is connected to the memory 92, the hard disk 93, and the network interface 94 through a bus.

The network interface 94 is a communication interface between the information processing apparatus 90 and an external device. The hard disk 93 stores various kinds of programs including an operating system (OS) and the like.

The LSI chip 91 includes multiple regulators 1A to 1C and cores 3A to 3C. The regulator 1A to 1C are arranged to correspond to the cores 3A to 3C, respectively. Each of the regulator 1A to 1C can control the cores 3A to 3C independently. For example, it is possible to differ respective voltage values, a voltage to be supplied to the core 3A by the regulator 1A, a voltage to be supplied to the core 3B by the regulator 1B, and a voltage to be supplied to the core 3C by the regulator 1C. Specifically, by varying the respective target voltages of the regulators 1A to 1C, the voltages to be supplied to the respective cores 3A to 3C can be varied.

When the operational capability of the information processing apparatus 90 is not fully utilized, it is possible to save power by reducing a processing load of a part of the cores 3A to 3C. For example, while the operational capability is fully utilized I the cores 3B to 3C, less operational capability can be utilized in the core 3A with a reduced frequency. When the operational capability is reduced by lowering the frequency, an operation voltage can be decreased. For example, while the target voltage of the regulator 1A is lowered to reduce the operation voltage of the core 3A, to make the core 3A operate at a lower speed, the target voltages of the regulators 1B to 1C can be maintained to keep the operation voltage of the cores 3B to 3C, to cause them to operate normally.

Inversely, it is possible to increase the operational capability increasing some of the operation voltages. For example, it is possible to make the core 3A operate at a high speed by increasing the target voltage of the regulator 1A to increase the operation voltage thereof, while the target voltages of the regulators 1B to 1C are maintained, to keep the operation voltage of the cores 3B to 3C as they are, and to make them operate normally.

When the operation voltages of the cores 3A to 3C are not controlled separately, all cores operate at the same voltage and unnecessary voltage consumption occurs. On the other hand, by controlling the operation voltages of the cores 3A to 3C independently by using the regulators 1A to 1C equipped in the voltage detection circuit 10 according to the present embodiment, a part of the voltages can be reduced, and it is possible to achieve a power-saving configuration.

As explained above, the voltage detection circuit according to the present embodiment performs regular sampling of a state of each inverter in the ROSC, and counts the number of transitions of each node by comparing sampling results of cycles shifted by one cycle. Thus, the voltage detection is performed by comparing the target voltage and an output voltage to a control target circuit by using the number of transitions.

The voltage detection circuit according to the present embodiment does not involve reset operation and the like and, therefore, can perform the voltage detection continuously without having a period in which voltage detection is disabled, and can suppress detection errors in the voltage detection. Moreover, because a counter is unnecessary to be mounted on each ROSC, a mounting area can be reduced.

In one aspect, the present invention enables to measure a voltage accurately.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A voltage detection circuit comprising:
a first ring oscillator and a second ring oscillator that have a plurality of inverters arranged in series in a ring shape;
a sampling unit that acquires, for each of the first ring oscillator and the second ring oscillator, a respective output signal that is output from each of the inverters on a per clock basis by following a system clock in each sampling cycle identical to a cycle of the system clock, the respective output signal including a respective first output signal in a first sampling cycle and a respective second output signal in a second sampling cycle that is one cycle previous to the first sampling cycle;
a transition-stage calculating unit that calculates:
a first number of transition stages that is a number of the inverters in which a value of an output signal has transitioned during the sampling cycle, based on the respective first output signal and the respective second output signal acquired for the first ring oscillator, and
a second number of transition stages, based on the respective first output signal and the respective second output signal acquired for the second ring oscillator; and
a voltage detecting unit that performs voltage detection based on the number of transition stages acquired by the transition-stage calculating unit.

2. The voltage detection circuit according to claim 1, wherein
the ring oscillators are constituted of
the first ring oscillator having a first inverter; and
the second ring oscillator having the same number of second inverter as the first inverter,
the sampling unit includes
a first sampling mechanism that acquires a first output signal from the first inverter in the first ring oscillator to which a target voltage is input; and
a second sampling mechanism that acquires a second output signal from the second inverter in the second ring oscillator to which a comparative output voltage is input,
the transition-stage calculating unit includes
a first transition-stage counting mechanism that calculates the first number of transition stages that are the number of transition stages of the first inverter based on the first output signal; and
a second transition-stage counting mechanism that calculates the second number of transition stages that is the number of transition stages of the second inverter based on the second output signal and
the voltage detecting unit detects the comparative voltage by comparing the first number of transition stages and the second number of transition stages.

3. The voltage detection circuit according to claim 1, wherein
the sampling unit acquires a specific output signal of the respective inverters in a specific sampling cycle, and a previous output signal of the respective inverters in a sampling cycle one cycle previous to the specific sampling cycle, and
the transition-stage calculating unit calculates the number of transition stages by comparing the specific output signal and the previous output signal.

4. The voltage detection circuit according to claim 3, wherein the transition-stage calculating unit calculates the number of transition stages by counting the number of the inverters in the ring oscillator from the inverter in which a value of an output signal has changed finally in the sampling cycle one cycle previous, to the inverter in which a value of an output signal has changed in the specific sampling cycle.

5. An information processing apparatus comprising:
a voltage detection circuit;
a voltage control circuit; and
a processor,
the voltage detection circuit includes
a first ring oscillator and a second ring oscillator that have a plurality of inverters arranged in series in a ring shape;
a sampling unit that acquires, for each of the first ring oscillator and the second ring oscillator, a respective output signal that is output from each of the inverters on a per clock basis by following a system clock in each sampling cycle identical to a cycle of the system clock, the respective output signal including a respective first output signal in a first sampling cycle and a respective second output signal in a second sampling cycle that is one cycle previous to the first sampling cycle;
a transition-stage calculating unit that calculates:
a first number of transition stages that is a number of the inverters in which a value of an output signal has transitioned during the sampling cycle, based on the respective first output signal and the respective second output signal acquired for the first ring oscillator, and a second number of transition stages, based on the respective first output signal and the respective second output signal acquired for the second ring oscillator; and a voltage detecting unit that performs voltage detection based on the number of transition stages acquired by the transition-stage calculating unit, the voltage control circuit controls a voltage to be output to the processor based on a voltage detected by the voltage detection circuit, and applies the voltage output to the processor to one of the ring oscillators, and the processor operates, receiving input of the voltage controlled by the voltage control circuit.

* * * * *